United States Patent [19]
Voutsas et al.

[11] Patent Number: 5,994,156
[45] Date of Patent: Nov. 30, 1999

[54] METHOD OF MAKING GATE AND SOURCE LINES IN TFT LCD PANELS USING PURE ALUMINUM METAL

[75] Inventors: Apostolos T. Voutsas; Yoshi Hibino, both of Vancouver, Wash.

[73] Assignees: Sharp Laboratories of America, Inc., Camas, Wash.; Kabushiki Kaisha, Osaka, Japan

[21] Appl. No.: 08/928,600

[22] Filed: Sep. 12, 1997

[51] Int. Cl.$^6$ .............................. H01L 21/03; H01L 21/84
[52] U.S. Cl. .............................................. 438/30; 438/158
[58] Field of Search ....................... 438/30, 158

[56] References Cited

U.S. PATENT DOCUMENTS

| | | | |
|---|---|---|---|
| 5,153,754 | 10/1992 | Whetten | 359/59 |
| 5,340,758 | 8/1994 | Wei et al. | 438/158 |
| 5,580,800 | 12/1996 | Zhang et al. | 437/40 |
| 5,831,283 | 11/1998 | Batey et al. | 257/66 |

FOREIGN PATENT DOCUMENTS

| | | |
|---|---|---|
| 7-169967 | 7/1995 | Japan . |
| 8-088215 | 4/1996 | Japan . |

OTHER PUBLICATIONS

Article entitled, A Highly Oriented Al[111] Textured Developed on Ultrathin Metal Underlayers by A. Kamijo and T. Mitsuzuka, published in J. Appl. Phys. 77(8), Apr. 15, 1995, pp. 3799–3804.

Article entitled, "Pure Aluminum Process Solution for Advanced LCDs", by R. Pethe, M. Bedekar, E. Demaray, C. Deshpandey and H. Sheo; SPIE vol. 3014, Feb. 1997, pp. 10–17.

Article entitled, "8.4: A Simplified Process for SVGA TFT–LCDS with Single–Layered ITO Source Bus–Lines" by A. Ban, Y. Nishioka, T. Shimada, M. Okamoto, M. Katayama, published in SID 96 Digest, pp. 93–96, 1996.

Article Entitled, 22.2: Pure Al and Al–Alloy Gate–Line Processes in TFT–LCDs by C.W. Kim, C.O. Jeong, H.S. Song, Y.S. Kim, J.H. Kim, J. H. Choi, M. K. Hur, H. G. Yang, J. H. Souk published in SID 96 Digest, pp. 337–340, 1996.

Article entitled, 22.3: Hillock–Free Al–Gate Materials Using Stress–Absorbing Buffer Layer for Large–Area AML-CDs by H. S. Seo, I. W. Kim, G. H. Lee, C. H. Hong and H. S. Soh publishsed in SID 96 Digest, pp. 341–344, 1996.

Article entitled, 22.4: Reliability Improvements for an a–Si TFT Matrix by Using Al:Ti Alloy by Y. Zhao, S. Xiong, C. Gu, Z.P. Wang, Z. Zhou, Z. Meng, J. Li, Y. Dai, L. Yao, J.J. Zhang, S. Ding, Z.L. Sun, W.D. Geng, H. Y. Li and D.L. Li, published in SID 96 Digest, pp. 345–348, 1996.

Article entitled, 35.4: Low–Resistivity AlAlloy for Large–Size and High Resolution TFT–LCDs by M. Hayashi, K. Inoue, S. Noumi, K. Sakata, T. Takeguchi, T. Morita, T. Eguchi, published in SID 97 Digest, pp. 885–888, 1997.

Article entitled, "S4–2 9.5–in. and 13.8–in. Diagonal TFT–LCDs with Low Resistance MoW Gate", by M. Ikeda, T. Oka, M. Atsuta, Y. Hara, Y. Tsuji, K. Susuki, Y. Kataoka, T. Dohi, Y. Sigemitsu, H. Tsuji, published in Asia Display '95, pp. 41–44., 1995.

*Primary Examiner*—Brian Dutton
*Attorney, Agent, or Firm*—David C. Ripma

[57] ABSTRACT

The invention provides a method of making low-resistance conductors on LCD glass panels for use in the fabrication and interconnection of thin film transistors in active-matrix LCDs. The conductors include pure aluminum metal, which has low resistivity and is suitable for the longer lines and conductors required in large-size (18-inch or more, measured diagonally) LCD panels with resolutions of XGA or better. An underlayer of titanium is first deposited on the glass, followed by an overlaer of aluminum. The Al/Ti conductive sheet material is then masked and etched to form lines and other conductors on the LCD glass substrate. A layer of gate dielectric is then deposited, preferably at a temperature of 300° C. or below. The invention minimizes hillock formation on the aluminum conductors without the additional cost and steps of depositing a capping layer of metal overlying the aluminum, and without the use of acid-treated glass.

18 Claims, 2 Drawing Sheets

METHOD OF MAKING GATE AND SOURCE LINES IN TFT LCD PANELS USING PURE ALUMINUM METAL

BACKGROUND AND SUMMARY OF THE INVENTION

The invention relates generally to liquid crystal display panels and, more particularly, to a method of making low-resistivity source and gate lines on LCD glass panel substrates using pure aluminum metal.

The length and density of bus-line conductors, such as source and gate lines, on large-size high-resolution liquid crystal display (LCD) panels present special manufacturing problems. As LCD panels grow in size, the bus-line conductors become longer. Long conductors formed on glass, such as the gate lines in bottom-gate thin film transistor (TFT) LCD matrices, exhibit problems associated with the resistivity of the conductive material, including signal delays and pulse distortion. Metals such as aluminum appear suitable for use as bus-line conductors on 18+ inch active-matrix liquid crystal display (AMLCD) panels having XGA resolution or higher. Pure aluminum offers the advantage of low resistivity (approximately 3.0-$\mu\Omega$-cm) but its use as a TFT bus-line material on glass presents practical problems.

One problem associated with the use of pure aluminum for LCD gate and source lines is the formation of undesirable surface features, known as hillocks, when the deposited aluminum is heated above 200° C. during subsequent processing. Hillocks are caused by a mismatch in the thermal expansion coefficient between the glass and the metal conductor. Stresses in the aluminum are released as hillocks when the substrate and metal are heated. Hillocks are a major impediment to the use of aluminum lines on glass because, for certain TFT architectures, the aluminum conductors must be covered with a layer of dielectric material, for example, the gate dielectric layer. Deposition of the dielectric layer involves processes which require the substrate to be heated above the aluminum yielding point (150° C.–200° C.). That is when hillocks are formed. Manufacturing yields suffer because hillocks can form shorts across the conductors, destroying devices.

One prior art approach to resolving the hillock problem is to form bus lines out of aluminum alloys instead of pure aluminum. Alloys of aluminum and tantalum (Ta), neodymium (Nd), zirconium (Zr), copper (Cu) and tungsten/molybdenum (W/Mo) all have less susceptibility to hillock formation at conventional process temperatures than does pure Al. However, such alloys do not have the low resistivity of pure aluminum. They also present handling problems during deposition and performance problems due to non-uniform distribution of the constituent metals.

Yet another approach to limiting hillock formation on pure Al bus lines is to cap the pure aluminum with a layer of a suitable metal such as titanium (Ti). Capping greatly reduces hillock formation and also is effective against corrosion. The principle disadvantage of capping is the additional process steps involved, which increases costs and lowers yield.

It would be preferable to find a method of forming pure Al conductors on glass without using a capping layer. Aluminum can be made more resistant to subsequent hillock formation if the Al is formed on a non-aluminum underlayer of titanium (Ti). Titanium film which exhibits a strong (001) texture tends to impart a strong (111) crystalline texture to an overlying aluminum layer. Studies have indicated that strongly textured (111) aluminum films demonstrate higher resistance to hillocking than weakly textured or randomly oriented films.

Still another factor which influences the susceptibility of aluminum film to hillock formation is the surface texture of the glass substrate on which the gate lines and other conductors are deposited. A typical transparent insulating substrate for use in LCD panels is 1737 Corning Code glass (untreated). Such glass, referred to herein as untreated glass, generally has a surface roughness (the height of measured surface features) of approximately 2.5 Å. An alternative glass substrate product available for LCD panels is 1737 glass that has been subjected by the manufacture to a dilute acid solution and, hence, is referred to as "treated" glass. The surface roughness of treated glass is approximately 5.1 Å. It has been found that the use of treated glass as a substrate for the deposition of Ti/Al layers reduces hillock formation during subsequent heating. It is believed that the greater surface wetness of the treated glass promotes the formation of voids at the interface between the aluminum layer and the titanium underlayer. The voids possibly allow for some stress relief in the plastic deformation of the aluminum during subsequent heat treatment, effectively providing an additional pathway for stress relief other than hillock formation. Whatever the actual mechanism, acid treated glass does appear to reduce hillock formation on the aluminum surface of Al/Ti films. Nevertheless, the extra cost of treated glass in large-scale manufacturing of TFT panels favors the use of untreated glass, if other methods of hillock control can be found.

It would be most advantageous to be able to provide low-resistivity pure aluminum conductive lines on LCD glass panels, with acceptably low hillock densities after deposition of a surface dielectric layer, using the lower-cost untreated glass substrate.

It would also be advantageous to form conductive lines containing pure aluminum on LCD glass panels in which hillock densities are acceptably low, after subsequent heating to form a surface dielectric layer, without the additional cost and complexity of forming a capping layer of titanium or another suitable metal on the Al.

It would be additionally advantageous to provide gate lines and other connectors on glass substrates formed of highly oriented (111) aluminum, which is resistant to hillock formation, using a process which provides for the deposit of silicon nitride or another dielectric material on the conductors but which does not require a process temperature above 300° C.

Accordingly, the present invention provides a method of forming conductors covered with a dielectric layer on glass or another transparent insulating substrate for use in forming active devices in liquid crystal displays. The method comprises a step of forming a conductive sheet having at least two layers on the substrate. The conductive sheet includes an underlayer of titanium, closest to the substrate, having a thickness generally in the range of 50 Å to 500 Å. The titanium underlayer is overlaid by a layer of aluminum having a thickness generally in the range of 750 Å to 2000 Å. The method further includes a step of forming a mask pattern on the conductive sheet to mask areas in the form of lines and conductors. The masked areas protect the conductive sheet material from removal during subsequent etching steps. The method further includes the step of etching selected areas of the conductive sheet material using an ion etch chamber. The etching proceeds in the areas unprotected by the mask pattern formed in the proceeding steps. The etching step uses an etch process which etches both titanium and aluminum so that both are removed in a single etch. Consequently, the conductive sheet material which remains following the etching step includes conductors in the form of lines on the substrate. The method additionally includes the step of depositing dielectric material on the conductive lines formed in the etching step. Dielectric material is deposited using a vapor deposition process which has a maximum process temperature below 370° C., and preferably at or below 300° C. As a result of the vapor deposition process, the conductors and lines on the substrate are covered with a dielectric layer to provide low-resistivity signal lines and connectors, including source and gate lines, extending between and incorporated into active devices and liquid crystal displays.

The invention is particularly directed to a method of forming conductive lines having an underlayer of titanium and an adjacent top layer of aluminum on the surface of standard (untreated) glass suitable for use in LCD displays. In its preferred embodiment, the method includes depositing a sheet of titanium between 300 Å and 500 Å thick on the glass, overlaid by an aluminum layer deposited on the titanium having a thickness between 1,000 Å and 1,200 Å. The specified thickness of titanium yields strongly textured (001) or (002) titanium film on the glass which, in turn, is known to promote the formation of strongly textured (111) aluminum in the specified range of thicknesses. The (111) aluminum is known to be more resistant to hillock formation during subsequent heating when a dielectric layer is deposited in accordance with the present invention.

The step of etching the aluminum Al/Ti sheet material in accordance with the present invention is preferably carried out in a reactive ion etch (RIE) chamber and comprises the following steps: i) a breakthrough step in which $BCl_3$ is introduced into the chamber; ii) a main etch to remove aluminum and titanium from the unmasked areas by introducing $Cl_2$ and $BCl_3$ into the chamber; and iii) introducing $CF_4$ into the chamber to remove residual etching byproducts.

The preferred method of depositing dielectric material on the substrate and the resultant conductive lines formed in the etching step include vapor deposition of silicon nitride ($SiN_x$). Preferred vapor deposition methodologies include Plasma Enhanced Chemical Vapor Deposition (PECVD) or Physical Vapor Deposition (PVD, or "sputtering"). The method preferably employs preheat and silicon nitride deposition process temperatures which do not exceed 300° C. As a result, the methodology of the present invention provides conductors formed of pure aluminum metal on a glass substrate, and coated with a dielectric layer of silicon nitride, in which hillock densities are minimized to within acceptable manufacturing tolerances.

DETAILED DESCRIPTION OF THE PREFERRED EMBODIMENT

The present invention provides a method of forming, on a glass substrate of the type used in liquid crystal display (LCD) panels, conductors such as gate and source lines or similar bus line conductors, connectors, and interconnects, out of conductive material that includes pure aluminum metal. The method includes covering the lines, conductors, connectors, and interconnects (referred to generally herein as "conductors") with a dielectric layer, preferably silicon nitride ($SiN_x$) or another suitable dielectric material. The dielectric layer serves as the gate dielectric in typical bottom-gate thin-film-transistors (TFTs) of the type used in active matrix LCD ("AMLCD") panels. Since heating during deposition of the gate dielectric layer is a principle cause of hillock formation in pure aluminum bus lines on glass, the invention is particularly directed to minimizing such hillock formation without the added cost of capping the aluminum layer with another metal such as titanium, or using acid-treated glass, and without using aluminum alloys which sacrifice conductivity.

Figure 1:
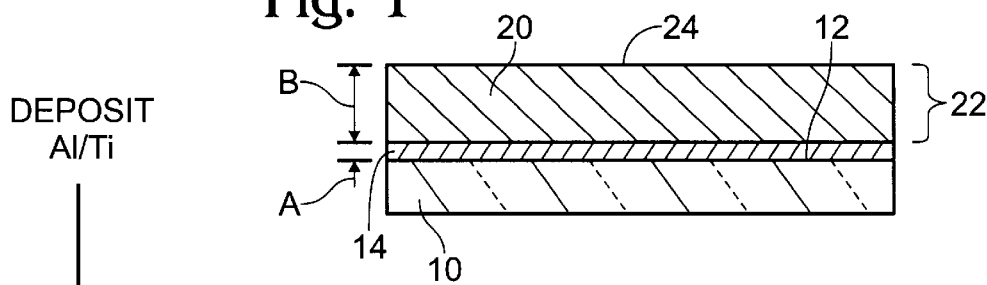
FIG. 1 is a partial cross-sectional view of glass substrate for use in LCD panels on which a layer of titanium and an overlying layer of aluminum metal have been deposited.

The method begins with the formation of conductors, such as gate and source lines, on glass or on other transparent insulating material of the type used in LCD panels. FIG. 1 shown a small cross sectional portion of a substrate 10. The substrate is preferably glass, such as 1737 Corning Code Glass (untreated) manufactured by the Corning Glass Company for use in flat-panel displays. "Untreated" glass means glass which has not been subjected to a dilute acid solution on a major surface, to roughen its surface. The present method uses untreated glass for substrate 10 because it is less expensive than acid-treated glass and the method is directed to a cost-effective methodology suitable for large scale manufacturing. It is known in the art that treated glass, having a surface roughened by a dilute acid solution, can reduce subsequent hillock formation in aluminum conductors. This invention tackles the more difficult problem of reducing hillock formation on aluminum conductors formed on untreated glass.

The first step in the method is the formation of a conductive sheet on glass substrate 10. The conductive sheet preferably has two layers of metal, Ti and Al, formed as follows. A layer of titanium metal, referred to herein as an underlayer of titanium, is first deposited on a major surface 12 of glass substrate 10. Titanium layer 14, which is alternatively referred to as the layer adjacent or closest to substrate 10, is deposited using any suitable metal deposition methodology well known to those skilled in the art. A typical method is sputtering (also called Physical Vapor Deposition or PVD). Preferably, Ti deposition is carried out at or above 300° C. in a PVD chamber at a plasma power level of 5–10kW and Ar pressure generally in the range of 2–5 mTorr. The preferred thickness A of titanium underlayer 14 is generally in the range of 50 Å to 500 Å. A layer of pure aluminum metal 20 is then deposited on Ti layer 14, preferably by sputtering. Preferably, Al deposition is carried out at or above 300° C. in a PVD chamber at a plasma power level above 10kW and Ar pressure generally in the range of 1–5 mTorr. To improve the quality of the deposited Al film, the base pressure of the PVD chamber should be at or below $1 \times 10^{-7}$ Torr. If a lower base pressure is used, the deposition temperature of the Al can be higher. The thickness B of aluminum layer 20 is generally in the range of 750 Å to 2000 Å.

The selected ranges for the thicknesses of the titanium and aluminum layers on substrate 10 ensures that the aluminum in layer 20 will have a strong (111) crystalline structure. Highly oriented strongly, textured (111) aluminum films are known to demonstrate resistance to hillocking. Previous research, for example as reported by Kamijo and Mitsuzuka in a paper entitled "A Highly Oriented Al [111] Texture Developed on Ultra Thin Metal Underlayers," J. App. Phys. 77 (8), 15 April 1995, pp. 3799–3804, has shown that an underlayer of properly oriented titanium tends to impart the desired (111) texture to subsequently deposited aluminum. Further, it has been discovered that a thin titanium film in the specified range (50–500 Å) deposited on glass exhibits the desirable (001) or (002) Ti orientation The preferred range of thicknesses for the Al/Ti layers in conductive sheet 22 deposited in the first step of the present invention are as follows. Titanium underlayer 14 preferably has a thickness A generally in the range of 300 Å–500 Å, and more specifically 370 Å. The preferred thickness B for aluminum layer 20 is generally in the range of 1,000 Å to 1,200 Å, and more specifically 1,100 Å. The inventors of the present method discovered that an aluminum overlayer 20 deposited on titanium on glass, yields fewer hillocks at the lower end of the first specified broader range (750 Å–2000 Å). Nevertheless, as a practical matter, in order to provide useful gate-and source-lines on large (greater than 18") LCD panels, it is necessary to have conductors slightly larger than the minimum 750 Å thickness to insure bus line signal capacity. For that reason the preferred thickness B for Al layer 20 is larger than 750 Å.

Figure 2:
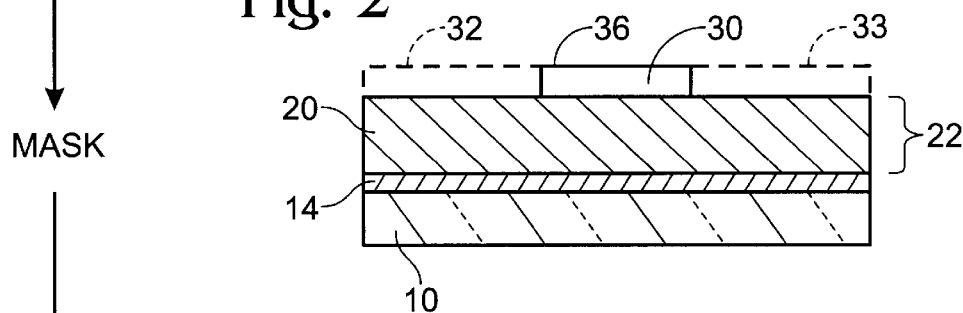
FIG. 2 is a cross-sectional view of the substrate and Al/Ti conductive sheet material of FIG. 1, including a partial cross-section of a mask pattern applied to the surface of the Al/Ti conductive sheet.

Al/Ti layers 20/14 are collectively referred to herein as conductive sheet 22 on substrate 10. The next step in the method, illustrated in FIG. 2, is the formation of a mask pattern on the top surface 24 of conductive sheet 22. The step of forming a mask pattern on the conductive sheet can be carried out by any suitable photolithographic technique well known to those skilled in the art. Typically, a layer of photoresist 30 is formed on the surface 24 of aluminum top layer 20. Using a suitable reticle or other means of targeted exposure, a mask pattern is exposed to appropriate radiation and developed. Development removes portions 32 and 33 of layer 30, shown with dashed lines in FIG. 2, leaving parts of the photoresist layer as masked areas which protect the conductive sheet 22 below from removal during subsequent etching steps (described below). Unremoved portion 36 of resist layer 30 in FIG. 2 forms part of a mask pattern of lines and other patterns where the underlying Al/Ti conductive sheet 22 is to remain on glass substrate 10 at the conclusion of the method of the present invention.

Figure 3:
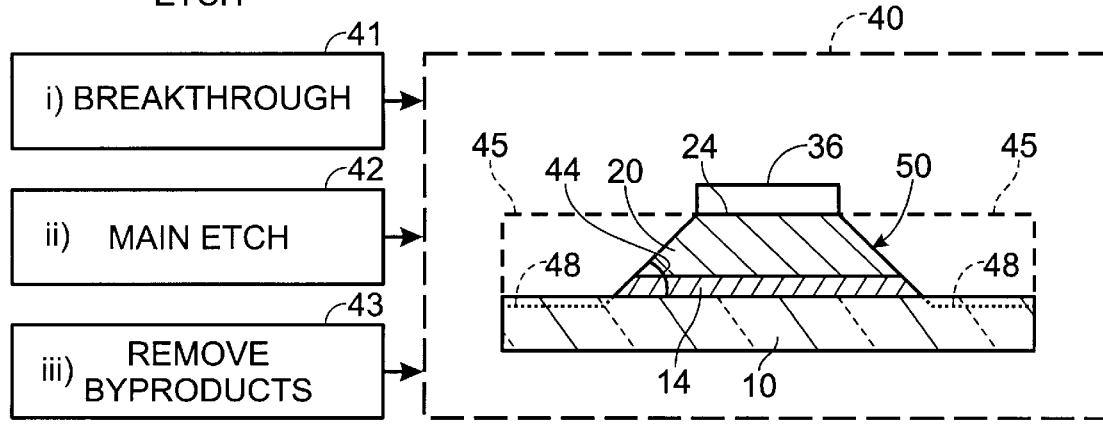
FIG. 3 is a partial schematic cross-sectional view of the substrate of FIG. 1 illustrating the process steps and the results of the etching step carried out in an ion etch chamber.

The next step in the method, illustrated in FIG. 3, is the etching step wherein selected areas of Al/Ti conductive sheet 22 are etched in an ion etch chamber. The etch chamber is schematically indicated by dashed line box 40. A suitable ion etch chamber for use in carrying out the etching step is a 1600 AKT RIE (Reactive Ion Etch) tool, manufactured by Applied Komatsu Technology, Inc., of Santa Clara, Calif. Such etch chamber tools sustain an RF ionizing plasma generated by flowing an RF current through various gases introduced into the chamber. The etch process includes several steps, three of which are schematically illustrated in FIG. 3. In each illustrated step, different reactive gases are introduced into chamber 40 at selected power levels and ambient pressures. The gases are ionized by the RF power, forming a plasma of highly reactive ions. The reactive ions then etch the target material. Higher power levels increase the concentration of ionizing species in the chamber and lower power levels produce correspondingly lower concentrations.

Referring to the method steps appearing to the left of chamber 40 in FIG. 3, the first part of the etch step of the present invention, termed "i) Breakthrough" 41 is the introduction of boron tetrachloride ($BCl_3$) into chamber 40 for an etch time generally in the range of 5 to 50 seconds. The flow rate of the $BCl_3$ is generally in the range of 50 to 200 standard cubic centimeters per minute (sccm), the chamber pressure is generally in the range of 5 to 50 mTorr, and the power level is generally in the range of 1,000 to 3,000 W. Breakthrough step 41 is used to etch through the native oxide on the surface 24 of aluminum film layer 20.

The next etch step is termed the "ii) Main Etch" 42 and includes flowing $Cl_2$ at a flow rate generally in the range of 50 to 200 sccm together with $BCl_3$ at a flow rate generally in the range of 1 to 100 sccm through chamber 40 at a chamber pressure generally in the range of 5 to 50 mTorr and a power level generally in the range of 1,000 to 3,000 W for a duration generally in the range of 60 to 300 seconds. Main Etch step 42 etches both aluminum overlayer 20 and titanium underlayer 14, except in those areas protected by a mask 36 and a taper are just outside the masked areas. The removed areas are shown with dashed lines at 45 in FIG. 3. The removal of the Al/Ti is carried out to yield a selected taper angle 44 generally in the range of 34° to 74°. Taper angle 44 is controlled principally by the overetch time of the Main Etch step 42; shorter overetch time yielding a smaller taper angle. The actual overetch time level used in Main Etch step 42 is determined empirically by experimentation to achieve the desired taper angle. In the method of the present invention, the preferred range for the taper angle is generally in the range of 34° to 45°. A low taper angle helps to ensure good coverage of the overlying dielectric layer laid down in a subsequent step. The actual selected etch time for the main etch, within the specified range, is generally determined by end-point detection (EPD) wherein a sensor in the tool detects when the entire thickness of the Al/Ti conductive sheet has been removed down to substrate 10. A certain amount of overetch into the glass, indicated schematically by dashed lines 48 in FIG. 3, is necessary to insure isolation between adjacent conductors on the glass. The amount of overetch is a matter of optimization but should generally be in the range of 5% to 30% of the overall thickness of Al/Ti conductive sheet 22.

The final part of the etch process within chamber 40 is termed "iii) Remove Byproducts" 43 and includes introducing tetrafluromethane ($CF_4$) at a flow rate generally in the range of 5 to 50 sccm and oxygen ($O_2$) at a flow rate generally in the range of 5 to 300 sccm into chamber 40 with a chamber pressure generally in the range of 50 to 200 mTorr and a power level generally in the range of 1,000 to 2,000 W for a duration generally in the range of 60 to 180 seconds. Remove Byproducts step 43, alternatively termed the plasma treatment step, removes residual etching byproducts, principally chlorine, from the surfaces exposed during the main etch.

Table 1 summarizes the settings for a reactive ion etch used in the etching step of the present invention.

TABLE 1

Reactive Ion Etch of Al/Ti Film

|  | Breakthrough | Main Etch | Remove Byproducts |
|---|---|---|---|
| Power | 1000–3000 W | 1000–3000 W | 1000–2000 W |
| $Cl_2$ flow |  | 50–200 sccm |  |
| $BCl_3$ flow | 50–200 sccm | 1–100 sccm |  |
| $CF_4$ flow |  |  | 5–50 sccm |

TABLE 1-continued

Reactive Ion Etch of Al/Ti Film

|  | Breakthrough | Main Etch | Remove Byproducts |
|---|---|---|---|
| $O_2$ flow |  |  | 5–300 sccm |
| Pressure | 5–50 mTorr | 5–50 mTorr | 50–200 mTorr |
| Etching Time | 5–50 sec | 60–300 sec | 60–180 sec |

Following the etching step the photoresist mask 36 is removed from the etched conductive sheet and the substrate 10 is transferred to a vapor deposition chamber for performing the step of depositing dielectric material on the substrate and conductors. It is during the deposit of a dielectric layer on the aluminum conductor that hillocks usually are formed. Hillocking is believed to be caused by the mismatch in the thermal expansion coefficients between glass and the Al/Ti film 22. As the aluminum is heated beyond its yielding point (150–200° C.) built up tensile stresses are relaxed and, unless otherwise dissipated, tend to form hillocks on the surface of the aluminum. The use of acid-treated glass for substrate 10, instead of untreated glass, reduces hillock formation because its rougher surface tends to leave voids between the aluminum and titanium layers. The voids provide pathways for stress relief without hillock formation. Untreated glass, having a smoother surface, causes fewer voids to form between the Al and Ti layers. Consequently, built-up stresses in the Al have correspondingly reduced internal pathways for stress relief, and the energy tends to form surface hillocks. The present invention is directed to a method for minimizing hillock formation on Al/Ti conductors formed on untreated (i.e., smooth surface) glass.

Figure 4:
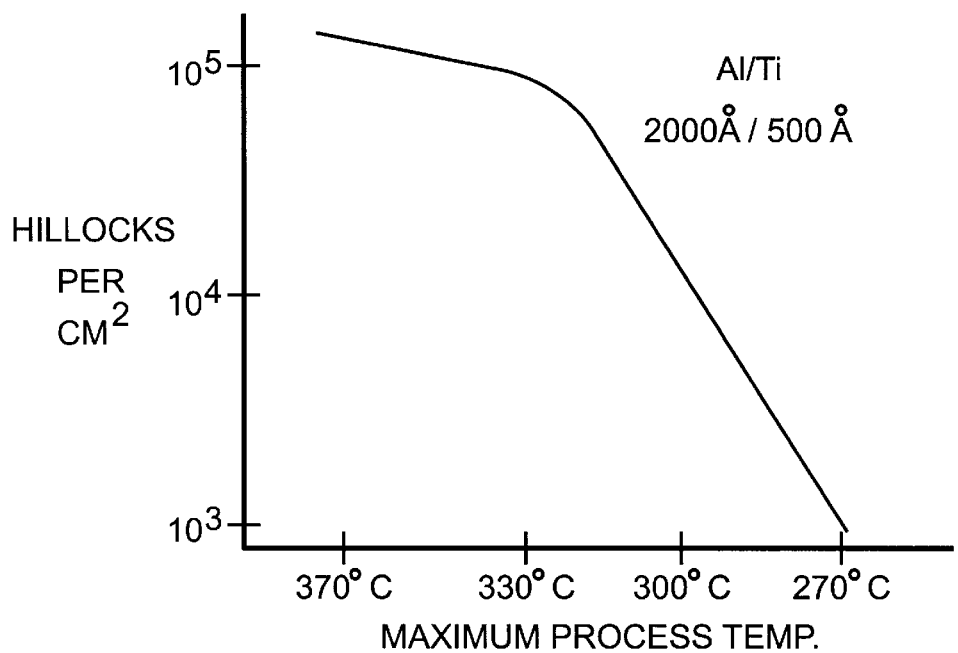
FIG. 4 is a graph showing hillock density as a function of process temperature for conductive sheet material formed on a glass substrate in accordance with the method of the present invention.

Several factors are important to reducing hillock formation in the method of the present invention. The deposition of textured titanium (001) or (002) film induces the formation of hillock-resistant (111) aluminum film on the Al/Ti conductive layer. The present invention also keeps hillock densities to within acceptable levels by minimizing the process temperature in the deposition of the overlying dielectric layer. FIG. 4 is a graphic representation of experimental data showing the relationship between hillock density and temperature in Al/Ti film on untreated glass, wherein the aluminum thickness is 2,000 Å and the titanium underlayer thickness is 500 Å. As shown in FIG. 4, if the maximum process temperature during dielectric deposition is 370° C., hillock densities of $1 \times 10^5$ are produced. The hillock densities drop sharply lower at temperatures below 330° C. The present invention is suitable for use with dielectric deposition processes having a maximum temperature of up to 370° C., if higher hillock density are acceptable. Preferably the step of depositing dielectric material on the conductors and substrate is limited to a maximum process temperature of 300° C., and more preferably to a process temperatures of 270° C. At 300° C. the hillock densities falls below $1 \times 10^4 / cm^2$ and at 270° C. the hillock density is less than $1 \times 10^3 / cm^2$.

Figure 5:
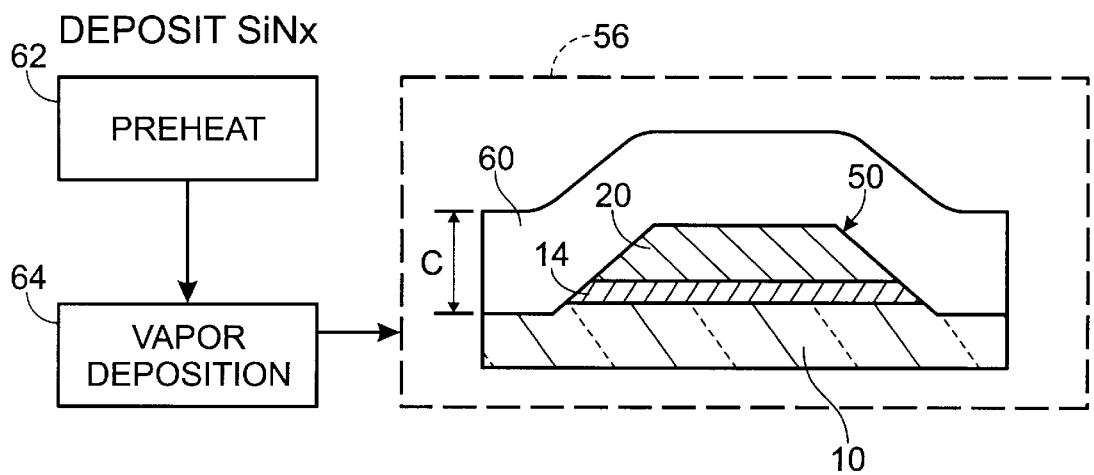
FIG. 5 is a schematic cross-sectional view of the substrate of FIG. 1 illustrating the deposition of dielectric material on the substrate and conductors using a vapor deposition chamber.

The step of depositing an overlying dielectric layer, also called gate dielectric on gate-line conductors, is shown in FIG. 5. Glass substrate 10, with conductors 50 formed thereon as a result of the preceding etching step, are transferred to a vapor deposition chamber schematically indicated by dashed line box 56 in FIG. 5. Chamber 56 is one of two alternative types of process chambers suitable for carrying out the present invention.

A first embodiment of the invention utilizes a process termed Plasma Enhanced Chemical Vapor Deposition (PECVD) to deposit an overlying dielectric layer 60 of silicon nitride ($SiN_x$) on the conductors and substrate. PECVD employs a vacuum chamber in which an ionized plasma is maintained and through which constituent gases are flowed to produce ion species of the material to be deposited. The steps in the deposition process are illustrated schematically to the left of chamber 56 in FIG. 5. First, a preheat step 62 wherein the substrate and conductors are preheated to a temperature below 370° C., and preferably at or below 300° C. The preheat step can be carried out outside chamber 56, and the heated glass panel substrate is then moved to the PECVD process chamber.

In process chamber 56, the next step 64 is carried out at a temperature below 370° C. and preferably at or below 300° C. The chamber pressure in PECVD chamber 56 is generally in the range of 500 to 2,000 mTorr at a power level generally in the range of 1,000 to 3,000 W. Vapor deposition step 64 is carried out by introducing nitrogen ($N_2$), ammonia ($NH_3$), and silane ($SiH_4$) into chamber 56 for a duration generally in the range of 30 to 500 seconds. The PECVD process deposits a layer of silicon nitride 60 on conductors 50 and glass substrate 10. The preferred overall thickness C of deposited silicon nitride layer 60 is generally in the range of 3,000 to 4,000 Å. The deposition time governs the thickness of the deposited silicon nitride. Table 2 gives the general overall ranges for the $N_2$, $NH_3$, and $SiH_4$ flow rates, as well as the power level, chamber pressure, and process time for carrying out PECVD deposition of silicon nitride in accordance with this embodiment of the present invention. The right column in Table 2 shows the preferred ranges for those parameters.

TABLE 2

Low-Temperature PECVD of $SiN_x$ Dielectric

| Parameter | Minimum | Maximum | Preferred |
|---|---|---|---|
| Power | 1000 W | 3000 W | 1500–2500 W |
| Pressure | 500 mTorr | 2000 mTorr | 1250–1750 mTorr |
| $N_2$ flow | 500 sccm | 3000 sccm | 1500–2500 sccm |
| $NH_3$ flow | 300 sccm | 2500 sccm | 500–1000 sccm |
| $SiH_4$ flow | 50 sccm | 500 sccm | 100–300 sccm |
| Process Temperature | Room Temperature | 300° C. | 270° C. |
| Preheat Temperature | Room Temperature | 300° C. | 270° C. |
| Process Time | 30 sec | 500 sec | 100–200 sec |

An alternative method of depositing dielectric material on the conductors and substrate in accordance with the present invention, also described with reference to FIG. 5, is the use of a physical vapor deposition (PVD) or "sputtering," in a sputtering chamber 56. This sputtering embodiment of the vapor deposition step also employs a preheat step 62 followed by a vapor deposition step 64. Sputtering is a non-reactive plasma process in which ionic species of constituent parts of the deposited product are ionized and caused to flow onto a target surface. In the sputtering embodiment of the vapor deposition step, the preheat step 62 is preferably carried out at a temperature generally in the range of from room temperature to 300° C. The LCD glass substrate is then transferred to a sputtering chamber 56 at a chamber pressure generally in the range of 2 to 15 mTorr.

Argon is then flowed through the chamber at a flow rate generally in the range of 20 sccm to 200 sccm, along with nitrogen ($N_2$) at a flow rate generally in the range of 5 sccm to 200 sccm, and hydrogen (H$_2$) at a flow rate generally in the range of from zero flow to 200 sccm. The PVD process is carried out for a duration generally in the range of 150 to 420 seconds, or until the thickness of the deposited silicon nitride reaches the selected thickness desired. As in the PECVD embodiment, the overall thickness of the deposited silicon nitride is deposited to a thickness generally in the range of 3,000 to 4,000 Å. The maximum process temperature in the sputtering embodiment, i.e., the maximum temperature to which the glass panel substrate and conductors are heated during either the preheat or deposition process, is preferably 300° C. or less. The more preferred temperature used in the sputtering process is 270° C.

Table 3 gives the general overall ranges for the Ar, N$_2$, and H$_2$ flow rates, as well as the power level, chamber pressure, and process time for carrying out PVD deposition of silicon nitride in accordance with this embodiment of the present invention. The right column in Table 3 shows the preferred ranges for those parameters.

TABLE 3

Low-Temperature PVD (Sputtering) of SiN$_x$ Dielectric

| Parameter | Minimum | Maximum | Preferred |
|---|---|---|---|
| Power | 1000 W | 5000 W | 1500–2500 W |
| Pressure | 2 mTorr | 15 mTorr | 10–12 mTorr |
| Ar flow | 20 sccm | 200 sccm | 100–150 sccm |
| N$_2$ flow | 5 sccm | 200 sccm | 100–150 sccm |
| H$_2$ flow | zero flow | 200 sccm | 50–150 sccm |
| Process Temperature | Room Temperature | 300° C. | 270° C. |
| Preheat Temperature | Room Temperature | 300° C. | 270° C. |
| Process Time | 150 sec | 420 sec | 100–300 sec |

The present invention provides a process for forming conductive lines containing pure aluminum metal on LCD glass panels, the lines being suitable for gate and source lines, and the lines being covered with a layer of dielectric material suitable for the gate dielectric in thin film transistors (TFTs). Although the process can be used on acid-treated glass panel substrate material, with its greater surface roughness and lower susceptibility to hillock formation, it is particularly directed to the more difficult challenge of forming pure aluminum conductors with a titanium underlayer, on untreated glass. The thicknesses of the titanium underlayer and the aluminum top layer are selected to yield highly oriented films, in particular (111) aluminum surface film, which has a reduced tendency to form hillocks during subsequent processing. An important part of the invention is the deposition of the dielectric layer at a temperature below 370° C., and preferably at 300° C. or below. At the preferred temperature of 300° C. or below, and particularly at 270° C., the invention yields hillock densities of 1×10$^3$/cm$^2$ or below, which is an acceptable level for manufacturing of TFT LCD panels.

Alternative embodiments are possible within the scope of the present invention. Other materials have also been investigated as underlayers, such as Cr, V, Y, Co, Ni, and Cu, although none has been found as effective as titanium for imparting the desired (111) texture to overlying aluminum. Although the preferred dielectric material deposited in the dielectric deposition step is silicon nitride, other suitable gate dielectric materials can be used for the deposited dielectric. Silicon dioxide, for example, could be used, or a similar dielectric material, if the maximum process temperature can be maintained below 370° C., and preferably at 300° C. or below. Other variations on the claimed method within the scope of the present invention will occur to those skilled in the art.

what is claimed is:

1. A method of providing conductors covered with a dielectric layer on a transparent insulating substrate for use in forming active devices in liquid cristal displays, comprising:

forming a conductive sheet on the substrate, the conductive sheet including an underlayer of titanium, closest to the substrate, the underlayer of titanium having a thickness generally in the range of 50 Å to 500 Å, overlaid by a layer of aluminum having a thickness generally in the range of 750 Å to 2000 Å;

forming a mask pattern on the conductive sheet including masked areas in the form of conductors including lines and connectors, the masked areas protecting the conductive sheet from removal during the following etching step;

using an ion etch chamber, etching selected areas of the conductive sheet unprotected by said mask pattern by means of an etch process using Cl$_2$ and BCl$_3$ to etch both said underlayer of titanium and said layer of aluminum followed by a plasma treatment using CF$_4$ to protect the aluminum from corrosion when exposed to air, whereby the conductive sheet which remains following the etching step includes said conductors on the substrate; and using a vapor deposition process which has a maximum process temperature below 370° C., depositing dielectric material on the resultant conductive lines formed in the etching step, whereby said resultant conductive lines are covered with said dielectric material to provide signal lines and connectors, including source and gate lines, on liquid crystal displays.

2. A method of providing conductors covered with a dielectric layer on a transparent insulating substrate for use in forming active devices in liquid crystal displays, comprising:

forming a conductive sheet on the substrate, the conductive sheet including an underlayer of titanium, closest to the substrate, the underlayer of titanium having a thickness generally in the range of 50 Å to 500 Å, overlaid by a layer of aluminum having a thickness generally in the range of 750 Å to 2000 Å;

forming a mask pattern on the conductive sheet including masked areas in the form of conductors including lines and connectors, the masked areas protecting the conductive sheet from removal during the following etching step:

using an ion etch chamber, etching selected areas of the conductive sheet unprotected by said mask pattern by means of an etch process which includes the following steps:

i) introducing BCl$_3$ into the ion etch chamber to remove surface material from the conductive sheet;

ii) introducing both Cl$_2$ and BCl$_3$ into the ion etch chamber to remove all layer of the conductive sheet from the selected areas to be etched; and iii) introducing CF$_4$ into the ion etch chamber to protect the aluminum from corrosion, whereby the conductive sheet which remains following the etching step includes said conductors on the substrate, and using a vapor deposition process which has a maximum process temperature below 370° C., depositing dielectric material on the resultant conductive lines formed in the etching step, whereby said resultant conductive lines are covered with said dielectric material to provide signal lines and connectors, including source and gate lines, on liquid crystal displays.

3. A method of providing conductors covered with a dielectric layer on a transparent insulating substrate for use in forming active devices in liquid crystal displays, comprising:

forming a conductive sheet on the substrate, the conductive sheet including an underlayer of titanium, closest to the substrate, the underlayer of titanium having a thickness generally in the range of 50 Å to 500 Å, overlaid by a layer of aluminum having a thickness generally in the range of 750 Å to 2000 Å;

forming a mask pattern on the conductive sheet including masked areas in the form of conductors including lines and connectors, the masked areas protecting the conductive sheet from removal during the following etching step;

using an ion etch chamber, etching selected areas of the conductive sheet unprotected by said mask pattern by means of an etch process which etches both said underlayer of titanium and said layer of aluminum, whereby the conductive sheet which remains following the etching step includes said conductors on the substrate; and using a vapor deposition process, depositing dielectric material on the resultant conductive lines formed in the etching step by steps which include:

preheating the substrate to a temperature at or below 300° C.; and in a plasma-enhanced chemical vapor deposition chamber at a temperature at or below 300° C., a pressure generally in the range of 500-mTorr to 2000-mTorr, and a power level generally in the range of 1000W to 3000W, introducing $N_2$, $NH_3$, and $SiH_4$ into the plasma-enhanced chemical vapor deposition chamber for a duration generally in the range of 30-seconds to 500-seconds to form a layer of silicon nitride, whereby said resultant conductive lines are covered with said dielectric material to Provide signal lines and connectors, including source and gate lines, on liquid crystal displays.

4. A method as in claim 3 in which said step of introducing $N_2$, $NH_3$, and $SiH_4$ into the plasma-enhanced chemical vapor deposition chamber includes:

introducing $N_2$ into the plasma-enhanced chemical vapor deposition chamber at a flow rate generally in the range of 500-sccm to 3000-sccm;

introducing $NH_3$ into the plasma-enhanced chemical vapor deposition chamber at a flow rate generally in the range of 300-sccm to 2500-sccm; and introducing $SiH_4$ into the plasma-enhanced chemical vapor deposition chamber at a flow rate generally in the range of 50-sccm to 500-sccm.

5. A method of providing conductors covered with a dielectric layer on a transparent insulating substrate for use in forming active devices in liquid crystal displays, comprising:

forming a conductive sheet on the substrate, the conductive sheet including an underlayer of titanium, closest to the substrate, the underlayer of titanium having a thickness generally in the range of 50 Å to 500 Å, overlaid by a layer of aluminum having a thickness generally in the range of 750 Å to 2000 Å;

forming a mask pattern on the conductive sheet including masked areas in the form of conductors including lines and connectors, the masked areas protecting the conductive sheet from removal during the following etching step;

using an ion etch chamber, etching selected areas of the conductive sheet unprotected by said mask pattern by means of an etch process which etches both said underlayer of titanium and said layer of aluminum, whereby the conductive sheet which remains following the etching step includes said conductors on the substrate; and using a vapor deposition process which has a maximum process temperature below 370° C., depositing silicon nitride on the substrate and the resultant conductive lines formed in the etching step, said step of depositing silicon nitride being carried out by plasma enhanced chemical vapor deposition (PECVD), including the following steps:

preheating the substrate to a temperature at or below 300° C. for 30-minutes or less; and in a plasma-enhanced chemical vapor deposition chamber at a temperature at or below 300° C., a pressure generally in the range of 1250-mTorr to 1750-mTorr, and a power level generally in the range of 1200W to 2000W, introducing the following for a duration generally in the range of 100-seconds to 200-seconds:

introducing $N_2$ into the plasma-enhanced chemical vapor deposition chamber at a flow rate generally in the range of 1500-sccm to 2500-sccm;

introducing $NH_3$ into the plasma-enhanced chemical vapor deposition chamber at a flow rate generally in the range of 500-sccm to 1000-sccm; and introducing $SiH_4$ into the plasma-enhanced chemical vapor deposition chamber at a flow rate generally in the range of 100-sccm to 300-sccm, whereby said resultant conductive lines are covered with said dielectric material to provide signal lines and connectors, including source and gate lines, on liquid crystal displays.

6. A method of providing conductors covered with a dielectric layer on a transparent insulating substrate for use in forming active devices in liquid crystal displays, comprising:

forming a conductive sheet on the substrate, the conductive sheet including an underlayer of titanium, closest to the substrate, the underlayer of titanium having a thickness generally in the range of 50 Å to 500 Å, overlaid by a layer of aluminum having a thickness generally in the range of 750 Å to 2000 Å;

forming a mask pattern on the conductive sheet including masked areas in the form of conductors including lines and connectors, the masked areas protecting the conductive sheet from removal during the following etching step;

using an ion etch chamber, etching selected areas of the conductive sheet unprotected by said mask pattern by means of an etch process which etches both said underlayer of titanium and said layer of aluminum, whereby the conductive sheet which remains following the etching step includes said conductors on the substrate; and using a vapor deposition process which has a maximum process temperature below 370° C., sputtering silicon nitride onto the substrate and said resultant conductive lines formed in the etching step, whereby said resultant conductive lines are covered with said silicon nitride to provide signal lines and connectors, including source and gate lines, on liquid crystal displays.

7. A method as in claim 6 in which said step of sputtering silicon nitride is carried out using a process with a maximum process temperature of 300° C. or less.

8. A method as in claim 7 in which said step of sputtering silicon nitride is carried out in a sputtering chamber at a pressure generally in the range of 2-mTorr to 15-mTorr, including introducing Argon at a flow rate generally in the range of 20-sccm to 200-sccm, $N_2$ at a flow rate generally in the range of 5-sccm to 200-sccm, and $H_2$ at a flow rate generally in the range of from zero flow to 200-sccm, and continuing the flow until a predetermined thickness of silicon nitride is deposited on the conductors and said substrate.

9. A method of providing conductive lines covered with a dielectric layer on a transparent insulating substrate for use in forming active devices in liquid crystal displays, comprising:

forming a conductive sheet on the substrate, the conductive sheet including an underlayek of titanium, closest to the substrate, the titanium layer having a thickness generally in the range of 50 Å to 500 Å, overlaid by a layer of aluminum having a thickness generally in the range of 750 Å to 2000 Å;

etching selected regions of the conductive sheet to remove conductive sheet material from the substrate to leave conductive lines on the substrate, said etching step being performed in an ion etch chamber and including the following steps:

i) at a power level in the chamber generally in the range of 1000W to 3000W and an ambient chamber pressure generally in the range of 5-mTorr to 50-mTorr, introducing $BCl_3$ into the chamber at a rate generally in the range of 50-sccm to 200-sccm for a duration generally in the range of 5-seconds to 50-seconds to remove surface material from the conductive sheet material;

ii) while maintaining the power level and said ambient chamber pressure as specified in step i), introducing $Cl_2$ into the chamber at a rate generally in the range of 50-sccm to 200-sccm and $BCl_3$ into the chamber at a rate generally in the range of 1-sccm to 100-sccm for a duration generally in the range of 60-seconds to 300-seconds to remove all layers of the conductive sheet from the selected regions of the substrate; and iii) after changing the power level and ambient pressure from the power level and ambient pressure as specified in step i) to a different power level and ambient Pressure as follows: a power level in the chamber generally in the range of 1000W to 2000W and an ambient chamber pressure generally in the range of 50-mTorr to 200-mTorr, introducing $CF_4$ into the chamber at a rate generally in the range of 5-sccm to 50-sccm and $O_2$ into the chamber at a rate generally in the range of 5-sccm to 300-sccm for a duration generally in the range of 60-seconds to 180-seconds to remove residual etching byproducts; and using a vapor deposition process which has a maximum process temperature at or below 300° C., depositing a layer of silicon nitride dielectric on the substrate and the conductive lines formed in the etching step, whereby said conductive lines are covered with a dielectric layer of silicon nitride to provide signal lines, including source and gate lines, on liquid crystal displays.

10. A method as in claim 9 in which said step of depositing a layer of silicon nitride includes:

preheating the substrate to a temperature at or below 300° C.; and in a plasma-enhanced chemical vapor deposition chamber at a temperature at or below 300° C., a pressure generally in the range of 500-mTorr to 2000-mTorr, and a power level generally in the range of 1000W to 3000W, introducing $N_2$, $NH_3$, and $SiH_4$ into the plasma-enhanced chemical vapor deposition chamber for a duration generally in the range of 30-seconds to 500-seconds to form a layer of silicon nitride.

11. A method as in claim 10 in which said step of introducing $N_2$, $NH_3$, and $SiH_4$ into the plasma-enhanced chemical vapor deposition chamber includes:

introducing $N_2$ into the plasma-enhanced chemical vapor deposition chamber at a flow rate generally in the range of 500-sccm to 3000-sccm;

introducing $NH_3$ into the plasma-enhanced chemical vapor deposition chamber at a flow rate generally in the range of 300-sccm to 2500-sccm; and introducing $SiH_4$ into the plasma-enhanced chemical vapor deposition chamber at a flow rate generally in the range of 50-sccm to 500-sccm.

12. A method as in claim 9 in which said step of depositing a layer of silicon nitride includes depositing a layer of silicon nitride on the substrate and the conductive lines by plasma enhanced chemical vapor deposition (PECVD), including the following steps:

preheating the substrate to a temperature at or below 300° C. for 30-minutes or less; and in a plasma-enhanced chemical vapor deposition chamber at a temperature at or below 300° C., a pressure generally in the range of 1250-mTorr to 1750-mTorr, and a power level generally in the range of 1200W to 2000W, introducing the following for a duration generally in the range of 100-seconds to 200-seconds:

introducing $N_2$ into the plasma-enhanced chemical vapor deposition chamber at a flow rate generally in the range of 1500-sccm to 2500-sccm;

introducing $NH_3$ into the plasma-enhanced chemical vapor deposition chamber at a flow rate generally in the range of 500-sccm to 1000-sccm; and introducing $SiH_4$ into the plasma-enhanced chemical vapor deposition chamber at a flow rate generally in the range of 100-sccm to 300-sccm.

13. A method as in claim 9 in which the transparent insulating substrate is untreated glass and the conductive sheet consists of an underlayer of titanium on the surface of the glass overlaid by a layer of aluminum.

14. A method as in claim 9 in which said step of forming a conductive sheet on the substrate includes depositing titanium on a surface of the substrate to a thickness generally in the range 300 Å to 500 Å, and then depositing the layer of aluminum on the underlayer of titanium to a thickness generally in the range 1000 Å to 1200 Å.

15. A method as in claim 9 in which said step of depositing a layer of silicon nitride includes sputtering a layer of silicon nitride onto the substrate and the conductive lines.

16. A method as in claim 15 in which said step of sputtering silicon nitride is carried out using a process with a maximum process temperature of 300° C. or less.

17. A method as in claim 16 in which said step of sputtering a layer of silicon nitride is carried out in a sputtering chamber at a pressure generally in the range of 2-mTorr to 15-mTorr, including introducing Argon at a flow rate generally in the range of 20-sccm to 200-sccm, $N_2$ at a flow rate generally in the range of 5-sccm to 200-sccm, and $H_2$ at a flow rate generally in the range of from zero flow to 200-sccm, and continuing the flow until a predetermined thickness of said layer of silicon nitride is deposited on the conductors and substrate.

18. A method as in claim 9 in which the step of depositing a layer of silicon nitride includes depositing a layer of silicon nitride to a thickness generally in the range of 3000 Å to 4000 Å.

* * * * *